United States Patent [19]
McKinney et al.

[11] Patent Number: 6,023,198
[45] Date of Patent: Feb. 8, 2000

[54] SELF-TUNING AND TEMPERATURE COMPENSATED VOLTAGE CONTROLLED OSCILLATOR

[75] Inventors: John K. McKinney, Plantation; Lorenzo Cruger, Sunrise; Branko Avanic, Miami, all of Fla.

[73] Assignee: Motorola, Inc., Schaumburg, Ill.

[21] Appl. No.: 09/093,238

[22] Filed: Jun. 8, 1998

[51] Int. Cl.[7] .................................................... H03L 7/00
[52] U.S. Cl. ............................................ 331/17; 331/176
[58] Field of Search .............................. 331/176, DIG. 2, 331/17

[56] References Cited

U.S. PATENT DOCUMENTS

| | | | |
|---|---|---|---|
| 4,156,204 | 5/1979 | Hargis | 331/12 |
| 4,270,098 | 5/1981 | Bowman | 331/96 |
| 4,270,213 | 5/1981 | Falk et al. | 455/77 |
| 4,454,483 | 6/1984 | Baylor | 331/11 |
| 4,574,243 | 3/1986 | Levine | 328/155 |
| 4,590,602 | 5/1986 | Wolaver | 375/120 |
| 4,609,884 | 9/1986 | Kindinger et al. | 331/109 |
| 4,714,899 | 12/1987 | Kurtzman et al. | 331/1 A |
| 4,764,737 | 8/1988 | Kaatz | 331/1 A |
| 4,975,650 | 12/1990 | Martin | 328/133 |
| 5,126,690 | 6/1992 | Bui et al. | 331/1 A |
| 5,382,921 | 1/1995 | Estrada et al. | 331/1 A |
| 5,389,898 | 2/1995 | Taketoshi et al. | 331/2 |
| 5,572,169 | 11/1996 | Iwamoto | 331/176 |
| 5,604,465 | 2/1997 | Farabaugh | 331/10 |
| 5,629,649 | 5/1997 | Ujiie | 331/17 |
| 5,686,864 | 11/1997 | Martin et al. | 331/1 A |

Primary Examiner—Benny Lee
Assistant Examiner—Henry Choe
Attorney, Agent, or Firm—Barbara R. Doutre

[57] ABSTRACT

A self-tuning VCO (116) receives a control voltage input (Vcont) (114) and an adjustable programmable voltage (Vadj) (122) and provides optimized locked conditions even under variations in temperature. A radio temperature is measured and stored (204) while Vadj (122) is initialized and stepped and Vcont (114) attempts to lock the VCO on frequency. Once a locked condition is achieved, the Vcont (114) is monitored to determine if it falls within a predetermined voltage range. If a non-optimized condition is detected, then the Vadj (122) is automatically adjusted until the VCO (116) becomes locked with a Vcont which falls within the predetermined voltage range. When a locked condition is achieved, the radio temperature is monitored and compared (212) to the original stored temperature (204). If a temperature threshold limit is reached (216) then the VCO is re-checks itself for a locked condition and re-optimizes itself to accommodate for the variations in temperature.

14 Claims, 2 Drawing Sheets

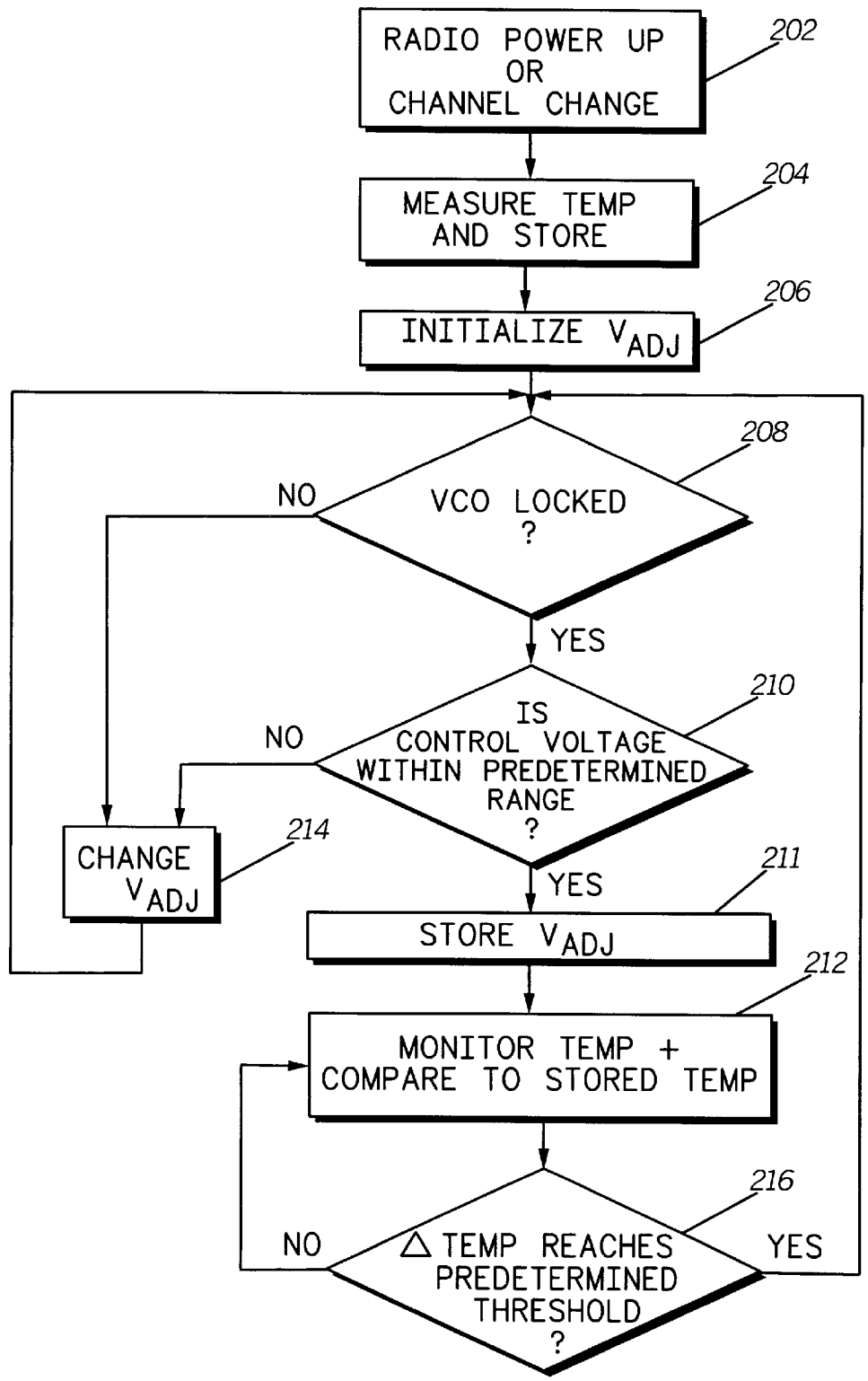

SELF-TUNING AND TEMPERATURE COMPENSATED VOLTAGE CONTROLLED OSCILLATOR

CROSS-REFERENCE TO RELATED APPLICATIONS

This application is related to co-pending applications Ser. No. 08/868,336 by McKinney, et al., filed Jun. 3, 1997, entitled "Apparatus and Tuning Method for a Voltage Controlled Oscillator," and Ser. No. 08/810,279 by Salvi, et al., filed Mar. 3, 1997, entitled "Method And Apparatus for Self-Tuning a Voltage Controlled Oscillator (VCO)," both assigned to Motorola, Inc.

TECHNICAL FIELD

This invention relates in general to voltage controlled oscillators and more specifically to the tuning of voltage controlled oscillators.

BACKGROUND

Voltage controlled oscillator (VCO) circuits are used in communication devices as the means of generating the desired frequency of operation. It is necessary to tune the VCO, usually as part of a phase locked loop (PLL) circuit, so that the communication device will lock on the desired frequency.

The bandwidth of a VCO is one of the most important parameters in VCO designs, however many types of compromises are often incurred due to the lack of bandwidth which generally relates back to lack of control voltage range. In many 3 volt radio designs, for example, the control voltage available to steer the VCO can be as little as 1 volt. This reduction in available control voltage is due to noise restrictions, tolerance restrictions, as well as temperature restrictions. Both noise and tolerance restrictions are fairly well understood in the art, and VCO designs are optimized with respect to these parameters. Temperature tolerance restrictions, on the other hand, are generally compensated for by narrowing the control voltage margins at both the low end and high end of the control voltage range which again limits the VCO's performance.

In many VCO designs wider bandwidth is considered desirable, however the disadvantage to increasing the bandwidth is that it makes the Ko(VCO gain parameter in MHz/V) much larger than it needs to be. The larger Ko tends to compromise the electrical performance of the VCO in terms of sideband noise and hum-and-noise. In the past, many VCOs were frequency-tuned which required some form of manual or factory level adjustment. One method used to eliminate frequency-tuning is to design the VCO frequency to a much wider bandwidth than necessary, but again, this has the disadvantage of making the Ko larger and degrading circuit performance. Voltage multiplier circuits can also be used to widen the VCO bandwidth by way of increasing the control voltage range and without necessarily increasing the Ko, but these circuits add unwanted complexity and cost to the circuit design.

Accordingly, there is a need for an improved VCO tuning apparatus and technique which provides for a wider control voltage range to be used which will enable improved performance in terms of noise, bandwidth, and other VCO parameters, without severely impacting the Ko.

BRIEF DESCRIPTION OF THE DRAWINGS

FIG. 2 a flow chart of a VCO tuning technique in accordance with the present invention.

DETAILED DESCRIPTION OF THE PREFERRED EMBODIMENT

Figure 1:
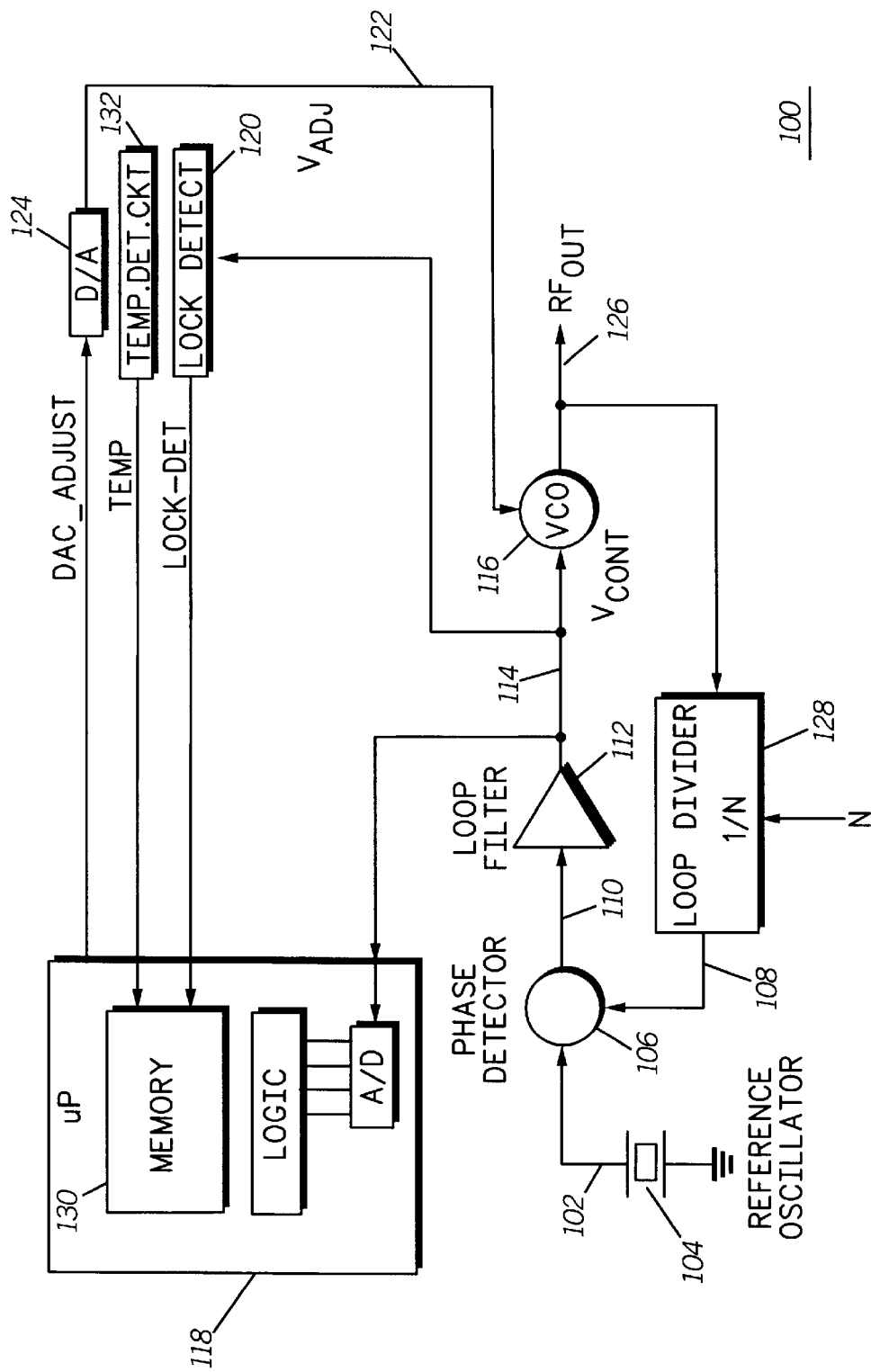
FIG. 1 is a voltage controlled oscillator in accordance with the present invention.

While the specification concludes with claims defining the features of the invention that are regarded as novel, it is believed that the invention will be better understood from a consideration of the following description in conjunction with the drawing figures, in which like reference numerals are carried forward.

A VCO apparatus and tuning technique to be described herein provides a circuit which locks on frequency within a phase locked loop (PLL) at a predetermined desired control voltage. This circuit then maintains the locked condition over temperature in a manner which ensures that the control voltage stays within optimized limits. This VCO and tuning technique provide the advantages of self-tuning capability.

Referring now to FIG. 1, there is shown a block diagram of a phase locked loop (PLL) 100 such as would be used in a radio communications product in accordance with the present invention. The PLL 100 receives reference input signal 102 which is typically derived from a crystal controlled reference oscillator 104. A phase detector 106 compares the phase difference between the reference input 102 and a divided radio frequency (RF) 108 in order to produce an error voltage 110. The error voltage 110 is filtered at a loop filter 112 to produce a DC signal which will be referred to as a voltage control signal (Vcont) 114. The control voltage signal 114 is fed to a VCO 116 to steer the frequency of the VCO. The output of the VCO (RF out) 126 is divided by integer N through loop divider 128 for phase locking.

In accordance with the present invention, the control voltage signal 114 is monitored by a microprocessor 118. In accordance with the present invention, the tuning of the VCO 116 is performed by checking for a locked VCO condition by monitoring the control voltage 114 through a lock detect circuit 120 while an adjustable programmable voltage (Vadj) 122 is stepped in value via internal programming of the microprocessor 118. The programmable voltage 122 is preferably generated from a digital-to-analog (D/A) converter 124 under microprocessor control 118.

In accordance with the present invention, the programmable voltage (Vadj) 122 is initialized and stepped in value to tune the VCO 116 to a predetermined desired frequency of operation while the control voltage 114 attempts to lock the VCO on frequency. Once the VCO is in a locked condition as determined by lock detect circuit 120, the control voltage 114 is then measured by the microprocessor 118 and compared to a predetermined voltage range stored in the microprocessor's internal memory 130. In accordance with the present invention, the D/A 124 will continue to adjust the programmable voltage 122 until the VCO locks on frequency with a control voltage that falls within the stored predetermined limits.

Control voltage value 114 is generated independently of external or manual control but is dependent on the D-to-A value that is set via internal programming. The microprocessor 118 adjusts the programmable voltage 122 via D-to-A 124 in order to optimize control voltage 114. The programmable voltage 122 is then preferably written to the radio programming code. This stored programming voltage can be used as the initialization value with which to attempt to lock the VCO 116 on the next power up sequence or channel change of the PLL 100. Alternatively, the initialization value may start at a minimum (or maximum or some other starting point) and step up (or down) from that point.

Further in accordance with the present invention, a temperature detect circuit 132 measures the radio temperature upon power up or channel change and stores this value in memory 130. Once the PLL 100 has reached a locked condition within the desired control voltage limits, the microprocessor 118 monitors the temperature detect circuit 132. As long as the VCO remains locked within a given temperature range the optimized locking parameters will remain substantially unchanged. However, if the radio temperature varies from the original stored temperature by some predetermined threshold, then the locked condition will be verified and the control voltage parameter will be rechecked to make sure it still falls within the desired limits. In accordance with the invention, the programmable voltage 122 is readjusted, if need be, to maintain an optimized locked condition for the new temperature environment. Thus the PLL 100 is able to maintain, not just a locked connection, but an optimized locked condition even over variations in temperature.

The PLL 100 of the present invention is completely self-tuning thereby eliminating the need for any test points or external programming. The VCO 116 locks on frequency without manual tuning of trim capacitors, without external adjustment of the programmable voltage (Vadj), and without external monitoring of the control voltage (Vcont).

Referring now to FIG. 2, there is shown a flowchart 200 of a VCO tuning technique 200 in accordance with the present invention. At step 202, the radio is powered up or has incurred a channel change. At step 204 the radio temperature is measured through the temperature detect circuit 132 and stored in memory 130. The programmable voltage is initialized to a value corresponding to the desired tuning frequency at step 206. This initialization step 206 is preferably performed by the D/A 124. The VCO is then checked to determine if it is in a locked condition via lock detect 120 at step 208. If the VCO is locked, then the VCO control voltage (Vcont) is measured internally to the radio by the microprocessor and compared to a predetermined voltage range, stored in internal memory 130, having upper and lower voltage limits at step 210. If the VCO is either unlocked at step 208 or if the control voltage value in a locked condition is not within the predetermined control voltage limits of step 210, then the programmable voltage is automatically adjusted by a predetermined amount in step 214. The step of adjusting the programmable voltage is performed by incrementing or decrementing the D/A through internal radio programming controlled by microprocessor 118. The steps of determining, measuring, comparing, and adjusting are repeated until the VCO has locked and the control voltage falls within the predetermined control voltage range stored in internal memory 130.

When the control voltage value does fall within the predetermined limits at step 210 the programmable voltage (Vadj) is preferably stored to the radio's programming code at step 211. In accordance with the present invention, the tuning procedure then proceeds to step 212 where the radio temperature is monitored and compared to the stored temperature. If the temperature delta between the two temperatures does not reach a predetermined threshold at step 216, the radio continues to monitor the current temperature and compare it to the initial stored temperature while maintaining the presently optimized locked condition in accordance with the present invention. However, in further accordance of the present invention, if the temperature delta does reach the predetermined threshold at step 216, then the tuning procedure returns to step 208 to ensure that a locked condition within optimized limits is maintained.

Upon the next power up or channel change, the initialization step 206 preferably uses the previously stored programmable voltage value from step 211. Alternatively, the initialization value at step 206 may start at a minimum (or maximum or some other starting point) and step up (or down) from that point.

As an example of the PLL 100 and tuning technique 200, consider the operation of a radio that remains on the same channel as its temperature environment changes. With the changes in temperature the control voltage may start to drift. If the temperature change gets extreme enough, the control voltage could shift out of the optimized region and conceivably even drift enough so that the PLL loses its locked condition. The PLL 100 and tuning technique 200 described by the invention will adjust the programming voltage so that the control voltage remains within the optimized limits. By maintaining the control voltage within optimized limits, the Ko value, which is determined by the VCO locking on frequency with a control voltage that falls within the optimized limits, will be maintained even over variations in temperature. The control voltage limits used in the VCO apparatus 100 and tuning technique 200 of the present invention are selected so as to provide optimal Ko conditions which in turn provide improved VCO performance (e.g. linear). The lower limit for Ko is preferably selected based on system transceiver frequency bandwidth requirements while the upper limit is preferably set where Ko is still within a linear region of VCO operation. Generally speaking for most VCOs the higher the control voltage the lower the Ko.

In accordance with the present invention, there are several programmable voltage settings (Vadj) where the VCO will be locked for a given PLL. By monitoring the control voltage (Vcont) of the PLL 100 as well as the temperature internally to the radio under locked conditions, the final programmable voltage (Vadj) setting 122 will correspond to a control voltage value 114 that falls within the upper and lower predetermined limits. Thus an optimized locked condition is maintained even over variations in temperature.

The PLL 100 and VCO tuning technique 200 described by the invention extend to a variety of oscillator configurations including but not limited to Hartley, Clapp, and Pierce oscillator configurations. The upper and lower control voltage limits are selected such that the final control voltage value will result in predictable electrical performance for every radio even as this radio incurs extremes in environmental changes out in the field.

Accordingly, there has been provided a self-tuning VCO apparatus and tuning technique which allows a VCO to be frequency tuned internally to the radio without outside intervention and without additional hardware. The self-tuning VCO described by the invention minimizes manufacturing problems associated with the tuning and trimming of VCOs. External monitoring and external programming have been eliminated thereby eliminating the need for any test points thereby further simplifying the manufacturing testing and tuning of the radio. The self-tuning VCO described by the invention provides the benefit of tuning the VCO in a closed-loop system and compensating for variations in temperature within that system to maintain a VCO that is both locked and operating in an optimal region of control voltage values. Furthermore, the self-tuning VCO apparatus and the tuning technique described by the invention are achieved without having to increase the control voltage range and thus does not require the use of voltage multiplier circuits.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of self-tuning a voltage controlled oscillator (VCO) circuit in a radio, comprising the steps of:

internally measuring the radio's initial temperature;

storing the radio's initial temperature;

initializing a programmable voltage;

applying the programmable voltage to the VCO to tune the VCO;

applying a control voltage to the VCO to lock the VCO;

determining if the VCO is in a locked condition;

measuring the control voltage internally to the radio if the VCO is in a locked condition;

comparing the control voltage of the VCO in the locked condition to a predetermined control voltage range stored in the radio;

automatically adjusting the programmable voltage if the VCO is in an unlocked condition or if the control voltage does not fall within the predetermined control voltage range;

repeating the steps of determining, measuring, comparing, and automatically adjusting, until the VCO is locked and the control voltage falls within the predetermined control voltage range;

monitoring the radio temperature when the VCO is locked and the control voltage falls within the predetermined control voltage range;

calculating the difference between the radio's initial temperature and the monitored temperature to determine whether a predetermined delta temperature threshold has been reached; and returning to the step of determining, if a predetermined temperature threshold has been reached.

2. The method of claim 1, wherein the programming voltage is generated by a digital-to-analog (D/A) converter.

3. The method of claim 2, wherein the step of adjusting comprises the step of incrementing the D/A.

4. The method of claim 2, where in the step of adjusting comprises the step of decrementing the D/A.

5. The method of claim 1, further including the step of storing the programmable voltage prior to the step of monitoring.

6. The method of claim 5, wherein the step of initializing includes the step of initializing the programmable voltage using the stored programmable voltage.

7. A method of self-tuning a VCO circuit in a radio, comprising the steps of:

selecting a control voltage range for the VCO;

initializing a programmable voltage corresponding to a predetermined tuning frequency;

applying a control voltage to the VCO to attempt to lock the VCO on the predetermined tuning frequency;

measuring the control voltage internally to the radio;

adjusting the tuning frequency through the programmable voltage until the VCO locks on frequency at a control voltage that falls within the selected control voltage range; and monitoring the radio temperature internally to the radio and returning to the step of measuring the control voltage if the radio temperature reaches a predetermined delta temperature threshold.

8. The method of claim 7, wherein the step of adjusting includes the steps of incrementing and decrementing the programming voltage until the control voltage falls within the selected control voltage range.

9. The method of claim 7, further including the step of storing the programming voltage prior to the step of monitoring.

10. The method of claim 9, wherein the step of initializing comprises the step of initializing the programmable voltage using the stored programmable voltage.

11. A phase locked loop for a radio, comprising:

a VCO receiving a programmable voltage and a control voltage and generating a radio frequency (RF) output in response thereto, the VCO being characterized by a Ko value dependent on the control voltage;

a loop divider for dividing the VCO RF output frequency signal into a divided RF signal;

a phase detector for comparing a reference frequency to the divided RF signal and producing an error signal;

a loop filter for filtering the error signal and generating the control voltage for steering the VCO;

a microprocessor for measuring the control voltage and adjusting the programmable voltage until the VCO automatically locks on frequency with the control voltage that falls within predetermined control voltage limits, the predetermined control voltage limits being set for optimized Ko conditions;

a temperature detect circuit for measuring the temperature of the radio; and the microprocessor monitoring the temperature detect circuit in order to detect an out of range delta temperature condition, and the microprocessor checking for a locked VCO within predetermined control voltage limits, and, if needed, adjusting the programmable voltage until the control voltage falls within the predetermined control voltage limits.

12. A phase locked loop as described in claim 11, wherein the adjustable programmable voltage is generated by a digital-to-analog (D/A) converter.

13. A phase locked loop as described in claim 11, wherein the microprocessor stores the predetermined control voltage limits.

14. A phase locked loop as described in claim 11, wherein the microprocessor stores the out of range delta temperature condition.

* * * * *